US011089694B2

(12) United States Patent
Awazu

(10) Patent No.: US 11,089,694 B2
(45) Date of Patent: Aug. 10, 2021

(54) PRINTED WIRING BOARD AND METHOD FOR MANUFACTURING PRINTED WIRING BOARD

(71) Applicant: IBIDEN CO., LTD., Ogaki (JP)

(72) Inventor: Masashi Awazu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/931,657

(22) Filed: May 14, 2020

(65) Prior Publication Data
US 2020/0367369 A1 Nov. 19, 2020

(30) Foreign Application Priority Data
May 16, 2019 (JP) .............................. JP2019-093065

(51) Int. Cl.
H05K 1/11 (2006.01)
H05K 3/06 (2006.01)
H05K 3/40 (2006.01)
H05K 3/46 (2006.01)
H05K 1/02 (2006.01)
H05K 1/18 (2006.01)

(52) U.S. Cl.
CPC ............. H05K 3/4688 (2013.01); H05K 1/11 (2013.01); H05K 1/111 (2013.01); H05K 3/06 (2013.01); H05K 3/4632 (2013.01); H05K 1/0284 (2013.01); H05K 1/0298 (2013.01); H05K 1/112 (2013.01); H05K 1/18 (2013.01)

(58) Field of Classification Search
CPC ....... H05K 3/4688; H05K 3/06; H05K 3/4632
See application file for complete search history.

(56) References Cited

U.S. PATENT DOCUMENTS

| 2009/0188706 A1* | 7/2009 | Endo ................... H01R 43/0256 174/257 |
| 2012/0067635 A1* | 3/2012 | Nang ................... B23K 1/0016 174/260 |
| 2015/0305153 A1* | 10/2015 | Imafuji ................ H05K 3/4007 174/261 |
| 2017/0245365 A1* | 8/2017 | Ishihara ................. H05K 1/113 |
| 2017/0317017 A1* | 11/2017 | Ishihara ................. H05K 1/181 |

FOREIGN PATENT DOCUMENTS

JP 2015-195305 A 11/2015

* cited by examiner

Primary Examiner — Ishwarbhai B Patel
(74) Attorney, Agent, or Firm — Oblon, McClelland, Maier & Neustadt, L.L.P.

(57) ABSTRACT

A printed wiring board includes a resin insulating layer, a conductor layer formed on a surface of the resin insulating layer, an outermost insulating layer formed on the resin insulating layer such that the outermost insulating layer is covering the conductor layer and has an opening extending to the conductor layer, and a metal post formed in the opening of the outermost insulating layer such that the metal post is protruding from the outermost insulating layer.

20 Claims, 3 Drawing Sheets

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2019-093065, filed May 16, 2019, the entire contents of which are incorporated herein by reference.

BACKGROUND OF THE INVENTION

Field of the Invention

The present invention relates to a printed wiring board having a metal post, and a method for manufacturing the printed wiring board.

Description of Background Art

Japanese Patent Application Laid-Open Publication No. 2015-195305 describes a printed wiring board having a conductor post. The entire contents of this publication are incorporated herein by reference.

SUMMARY OF THE INVENTION

According to one aspect of the present invention, a printed wiring board includes a resin insulating layer, a conductor layer formed on a surface of the resin insulating layer, an outermost insulating layer formed on the resin insulating layer such that the outermost insulating layer is covering the conductor layer and has an opening extending to the conductor layer, and a metal post formed in the opening of the outermost insulating layer such that the metal post is protruding from the outermost insulating layer.

According to another aspect of the present invention, a method for manufacturing a printed wiring board includes forming a seed layer on a resin insulating layer, forming an electrolytic plating film on the seed layer, forming a metal post including electrolytic plating on the electrolytic plating film, removing the seed layer exposed from the electrolytic plating film, forming an outermost insulating layer on the seed layer, the electrolytic plating film and the metal post such that the electrolytic plating film and the metal post are embedded in the outermost insulating layer, and thinning the outermost insulating layer such that a portion of the metal post including the electrolytic plating protrudes from the outermost insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
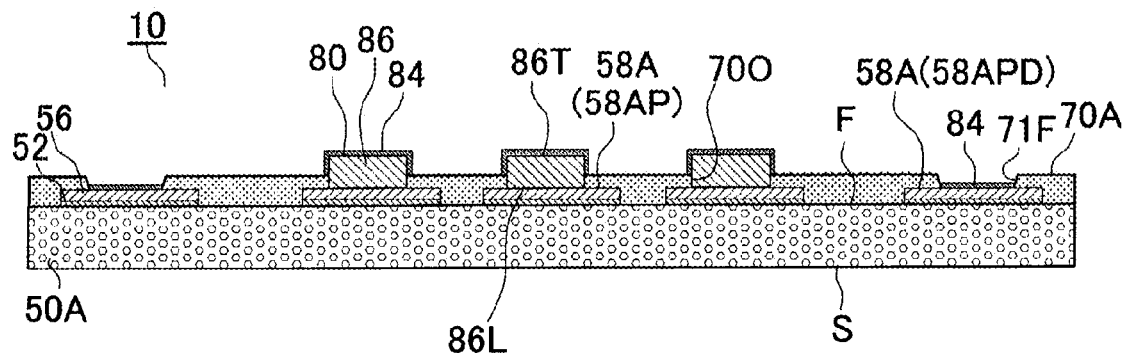
FIG. 1A is a cross-sectional view of a printed wiring board according to an embodiment of the present invention.

Embodiments will now be described with reference to the accompanying drawings, wherein like reference numerals designate corresponding or identical elements throughout the various drawings.

Embodiment

FIG. 1A illustrates a printed wiring board 10 of an embodiment.

The printed wiring board 10 includes: a resin insulating layer (first resin insulating layer) (50A) having a first surface (F) and a second surface (5) on an opposite side with respect to the first surface (F); a conductor layer (first conductor layer) (58A) formed on the first surface (F) of the first resin insulating layer (50A); an outermost insulating layer (outermost first insulating layer) (70A) that is formed on the first resin insulating layer (50A) and the first conductor layer (58A) and has first openings (70O) reaching the first conductor layer (58A); and metal posts 86 that are respectively formed in the first openings (70O) and protrude from the outermost first insulating layer (70A). Since the metal posts 86 protrude from the outermost first insulating layer (70A), a distance between adjacent metal posts 86 can be reduced. Even when the distance between adjacent metal posts 86 is small, a short circuit is unlikely to occur between adjacent metal posts 86.

The first conductor layer (58A) is formed by a seed layer 52 formed on the first surface (F) of the first resin insulating layer (50A), and an electrolytic plating film (first electrolytic plating film) 56 formed on the seed layer 52. The seed layer 52 is in contact with the first surface (F). The first electrolytic plating film 56 is in contact with the seed layer 52. The first electrolytic plating film 56 is an electrolytic copper plating film.

The metal posts 86 are directly formed on the first electrolytic plating film 56. The metal posts 86 and the first electrolytic plating film 56 are formed by different processes. Therefore, although the metal posts 86 are in contact with the first conductor layer (58A), the metal posts 86 and the first conductor layer (58A) are not integrally formed. An interface exists between each of the metal posts 86 and the first conductor layer (58A). The first conductor layer (58A) includes a metal post conductor circuit (58AP). The metal posts 86 are directly connected to the metal post conductor circuit (58AP). The metal posts 86 are directly formed on the metal post conductor circuit (58AP).

The metal posts 86 are formed by an electrolytic plating film (second electrolytic plating film) 80. When the metal posts 86 are formed by the second electrolytic plating film 80 only, an interface does not exist in each of the metal posts 86. Therefore, reliability of connection via the metal posts 86 can be increased. Resistance of each of the metal posts 86 is unlikely to change.

The first electrolytic plating film 56 and the second electrolytic plating film 80 are formed using the common seed layer 52. The second electrolytic plating film 80 is directly formed on the first electrolytic plating film 56. Therefore, adhesive strength between the first electrolytic plating film 56 and the second electrolytic plating film 80 can be increased. Even when the interface exists between each of the metal posts 86 and the first conductor layer (58A), reliability of connection between each of the metal posts 86 and the first conductor layer (58A) can be maintained for a long time. A thickness of the first electrolytic plating film 56 and a thickness (h1) of the second electrolytic plating film 80 can be easily controlled. Variation in heights (H1) of the metal posts 86 can be reduced.

Figure 3A:
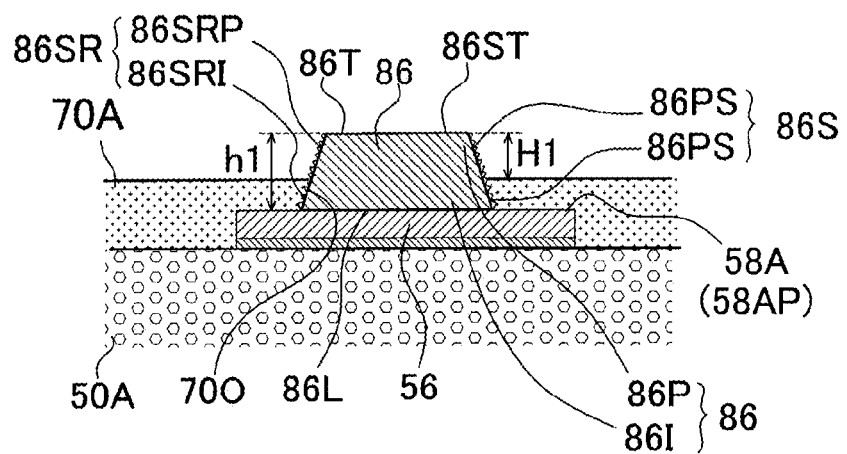
FIGS. 3A and 3B each illustrate a metal post.

The metal posts 86 each have a lower surface (86L) and an upper surface (86T) on an opposite side with respect to the lower surface (86L). As illustrated in FIG. 3A, the lower surface (86L) is in contact with the first electrolytic plating film 56. The metal posts 86 each become thicker from the upper surface (86T) toward the lower surface (86L). A side wall (86S) of each of the metal posts 86 is tapered from the lower surface (86L) toward the upper surface (86T). The upper surface (86T) can be reduced in size. Therefore, the distance between adjacent metal posts can be reduced.

Figure 3B:
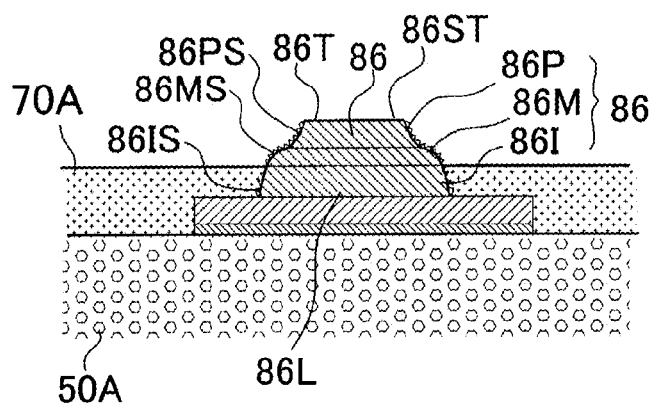

Each of FIGS. 3A and 3B is an enlarged view of a metal post 86. FIGS. 3A and 3B are each obtained by cutting a metal post 86 along a plane perpendicular to the upper surface (86T).

As illustrated in FIG. 3A, the metal posts 86 are each divided into a portion (first opening inner-side portion) (86I) inside a first opening (70O) and a portion (protruding portion) (86P) protruding from the outermost first insulating layer (70A). The first opening inner-side portion (86I) and the protruding portion (86P) are integrally formed. The first opening inner-side portion (86I) and the protruding portion (86P) are continuously formed. There is no interface between the first opening inner-side portion (86I) and the protruding portion (86P).

As illustrated in FIG. 3B, it is also possible that the metal posts 86 are each formed to include a first opening inner-side portion (86I), a protruding portion (86P), and a middle portion (86M) connecting the first opening inner-side portion (86I) and the protruding portion (86P). The protruding portion (86P) and the middle portion (86M) are integrally formed. The first opening inner-side portion (86I) and the middle portion (86M) are integrally formed. The first opening inner-side portion (86I) has a side wall (86IS). The middle portion (86M) has a side wall (86MS). The protruding portion (86P) has a side wall (86PS). Among a size of inclination of the side wall (86IS), a size of inclination of the side wall (86MS) and a size of inclination of the side wall (86PS), the size of the inclination of the side wall (86MS) is the smallest. Since the metal posts 86 each have such a middle portion (86M), the upper surface (86T) can be reduced in size. Insulation reliability between adjacent metal posts 86 can be increased.

As illustrated in FIGS. 3A and 3B, the side wall (86S) of each of the metal posts 86 has unevenness (86SR). The upper surface (86T) of each of the metal posts 86 has unevenness (86ST). The side wall (86IS) of the first opening inner-side portion (86I) has unevenness (86SRI). The side wall (86PS) of the protruding portion (86P) has unevenness (86SRP). A size of the unevenness (86SRI) is larger than a size of the unevenness (86SRP). An adhesive force between the metal posts 86 and the outermost first insulating layer (70A) can be increased. Migration starting from the side wall (86PS) of the protruding portion (86P) can be suppressed.

The size of the unevenness (86SRI) is larger than a size of the unevenness (86ST).

The printed wiring board 10 can have a corrosion resistant layer 84 covering the protruding portions (86P).

As illustrated in FIG. 1A, the outermost first insulating layer (70A) can have second openings (71F). The second openings (71F) respectively expose pads (58APD) included in the first conductor layer (58A). A corrosion resistant layer 84 is formed on the pads (58APD). An example of the corrosion resistant layer 84 is a Ni/Pd/Au layer. A Ni layer is formed on the pads. A Pd layer is formed on the Ni layer. An Au layer is formed on the Pd layer. The corrosion resistant layer 84 on the pads (58APD) and the corrosion resistant layer 84 covering the protruding portions (86P) are the same. The two are simultaneously formed. The printed wiring board 10 does not have metal posts 86 on the pads (58APD).

Modified Embodiments

Figure 1B:
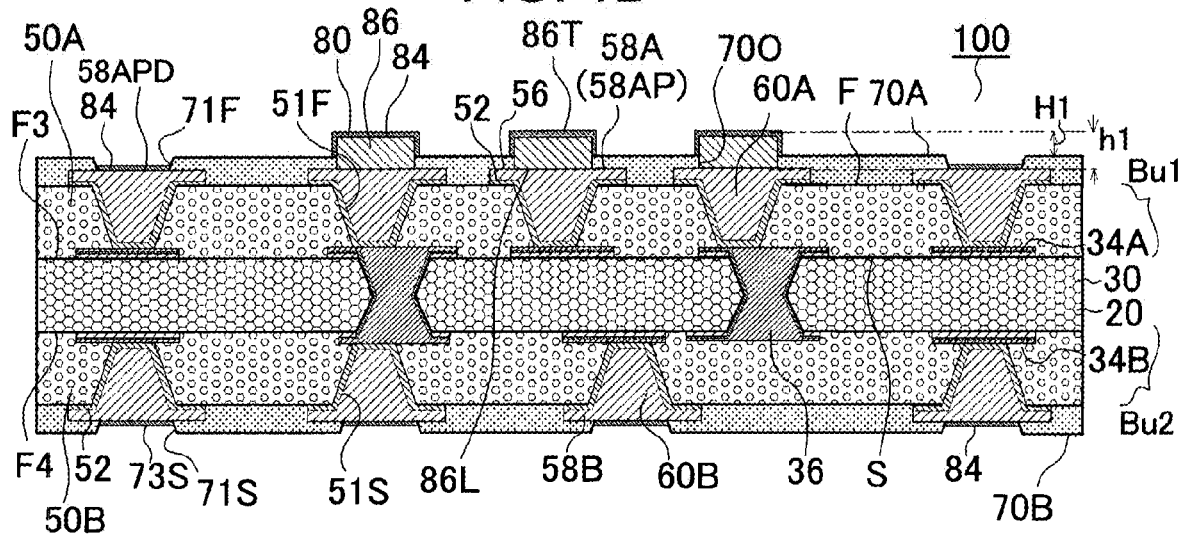
FIG. 1B is a cross-sectional view of a printed wiring board of a modified embodiment of the embodiment.

FIG. 1B illustrates a printed wiring board 100 of a modified embodiment. The printed wiring board 100 of the modified embodiment includes: a core substrate 30 having a third surface (F3) and a fourth surface (F4) on an opposite side with respect to the third surface (F3); a first build-up layer (Bu1) formed on the third surface (F3) of the core substrate 30; a second build-up layer (Bu2) formed on the fourth surface (F4) of the core substrate 30; an outermost first insulating layer (70A) formed on the first build-up layer (Bu1); and an outermost second insulating layer (70B) formed on the second build-up layer (Bu2).

The core substrate 30 is formed to include: a resin substrate 20 having a third surface (F3) and a fourth surface (F4) on an opposite side with respect to the third surface (F3); a third conductor layer (34A) on the third surface (F3); a fourth conductor layer (34B) on the fourth surface (F4); and through-hole conductors 36 that penetrate the resin substrate 20 and connect the third conductor layer (34A) and the fourth conductor layer (34B) to each other. The third surface (F3) of the core substrate 30 and the third surface (F3) of the resin substrate 20 are the same surface. The fourth surface (F4) of the core substrate 30 and the fourth surface (F4) of the resin substrate 20 are the same surface.

The printed wiring board of the embodiment (the printed wiring board 10 illustrated in FIG. 1A) is formed on the third surface (F3) and the third conductor layer (34A). Further, first via conductors (60A) that penetrate the first resin insulating layer (50A) and connect the third conductor layer (34A) and the first conductor layer (58A) to each other are formed. As a result, the first build-up layer (Bu1) and the outermost first insulating layer (70A) are formed on the third surface of the core substrate 30. The second surface (S) of the first resin insulating layer (50A) and the third surface (F3) of the resin substrate 20 face each other. The metal post conductor circuit (58AP) is directly formed on the first via conductors (60A). The first via conductors (60A) are directly connected to the metal post conductor circuit (58AP). The first via conductors (60A) and the metal post conductor circuit (58AP) are integrally formed. Each of the first via conductors (60A) becomes thicker toward the metal post conductor circuit (58AP). Therefore, even when an electronic component is mounted on the metal posts 86, reliability of connection via the first via conductors (60A) can be maintained for a long time.

The second build-up layer (Bu2) is formed to include: a second resin insulating layer (50B) formed on the fourth surface (F4) and the fourth conductor layer (34B); a fifth conductor layer (58B) formed on the second resin insulating layer (50B); second via conductors (60B) that penetrate the second resin insulating layer (50B) and connect the fourth conductor layer (34B) and the fifth conductor layer (58B) to each other.

The outermost second insulating layer (70B) is formed on the second resin insulating layer (50B) and the fifth conductor layer (58B). The outermost second insulating layer (70B) has openings (71S). The fifth conductor layer (58B) exposed from the openings (71S) forms second pads (73S). A corrosion resistant layer 84 is formed on the second pads (73S). The corrosion resistant layer 84 on the second pads (73S) and the corrosion resistant layer 84 on the pads (58APD) are the same.

APPLICATION EXAMPLE

Figure 1C:
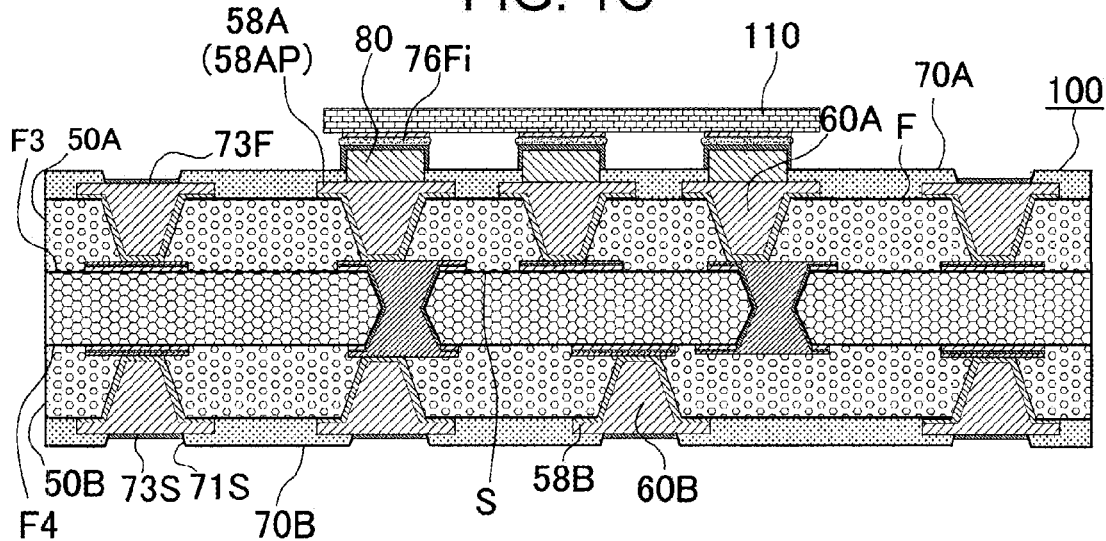
FIG. 1C is an application example of the printed wiring board of the embodiment.

FIG. 1C illustrates an application example formed by the printed wiring board 100 of the embodiment and an electronic component 110 mounted on the printed wiring board 100. The electronic component 110 is connected to the printed wiring board 100 via the metal posts 86. The metal posts 86 and the electronic component 110 are joined by solder bumps (76Fi) on the metal posts 86. Since the printed wiring board 100 has the metal posts 86, the volume of each of the solder bumps (76Fi) can be reduced. The solder bumps (76Fi) can be formed on the side walls (86PS) of the protruding portions (86P). Even when the solder bumps (76Fi) are formed on the side walls (86PS), since the size of the unevenness (86SRP) is small, migration starting from the side walls (86PS) can be suppressed. Since the metal posts 86 each become thicker from the upper surface (86T) toward the lower surface (86L), a short circuit due to the solder bumps (76Fi) can be prevented.

Manufacturing Method of Embodiment

A method for manufacturing the printed wiring board 10 of the embodiment is illustrated in FIGS. 2A-2E.

Figure 2A:
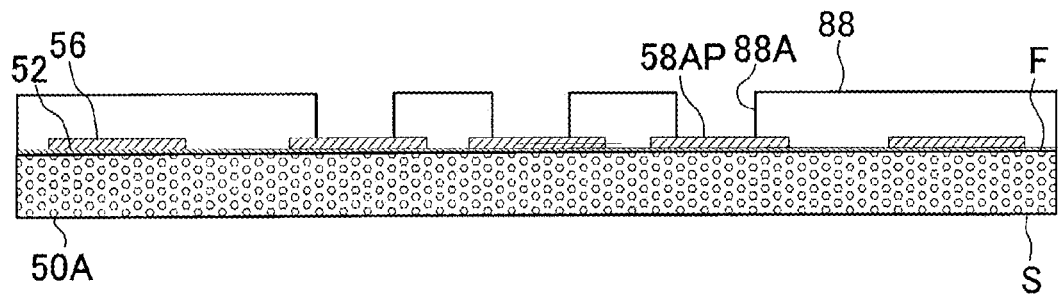
FIGS. 2A-2E are manufacturing process diagrams of the printed wiring board of the embodiment.
Figure 2B:
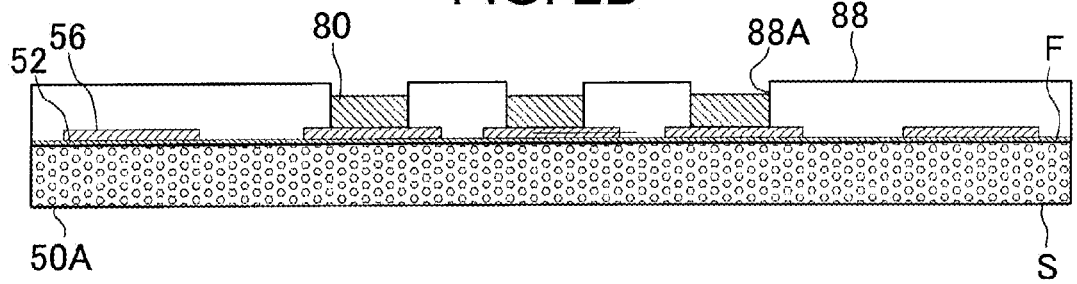
Figure 2C:
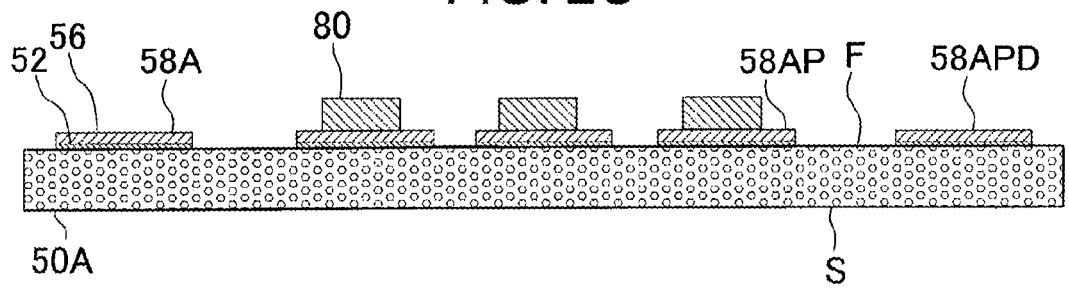
Figure 2D:
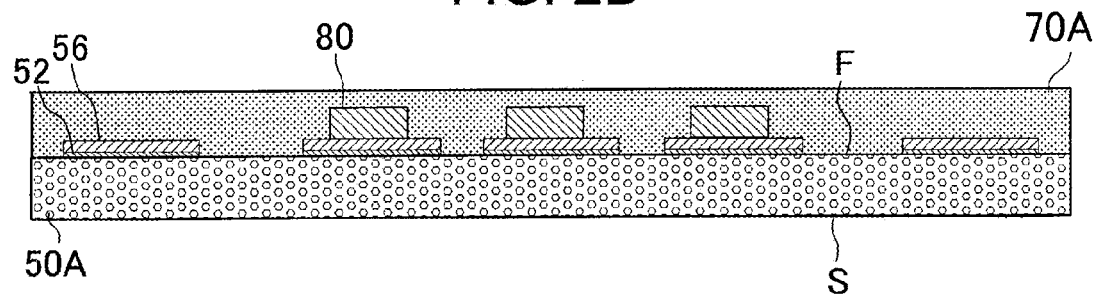
Figure 2E:
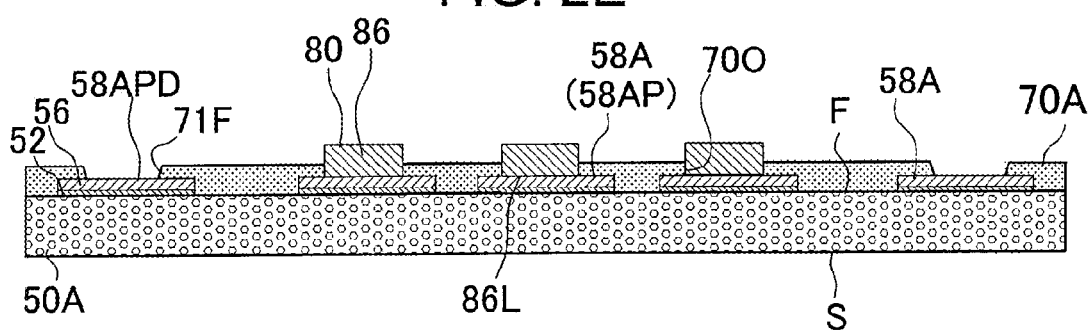

The first resin insulating layer (50A) having the first surface (F) and the second surface (S) on an opposite side with respect to the first surface (F) is prepared. The outermost insulating layer (outermost first insulating layer) (70A) is prepared. The seed layer 52 is formed on the first surface (F) of the first resin insulating layer (50A). An example of the seed layer 52 is a copper film formed by electroless copper plating film or sputtering. A first plating resist is formed on the seed layer 52. The first electrolytic plating film 56 is formed on the seed layer 52 exposed from the first plating resist. The first plating resist is removed. A second plating resist 88 is formed on the seed layer 52 and the first electrolytic plating film 56. As illustrated in FIG. 2A, the second plating resist 88 has openings (88A) exposing the first electrolytic plating film 56, and covers outer peripheries of the first electrolytic plating film 56. As illustrated in FIG. 2B, the second electrolytic plating film 80 is formed on the first electrolytic plating film 56 exposed from the second plating resist 88. The openings (88A) expose the metal post conductor circuit (58AP). The first electrolytic plating film 56 and the second electrolytic plating film 80 on the first electrolytic plating film 56 are formed using the common seed layer 52. Therefore, a thickness of the second electrolytic plating film 80 can be easily controlled. Since the second electrolytic plating film 80 forms the metal posts 86, the upper surfaces (86T) of the metal posts 86 are easily positioned on the same plane. The variation in the heights (H1) of the metal posts 86 can be reduced. The second plating resist 88 is removed. As illustrated in FIG. 2C, the seed layer 52 exposed from the first electrolytic plating film 56 and the second electrolytic plating film 80 is removed. The first conductor layer (58A) formed by the seed layer 52 and the first electrolytic plating film 56 on the seed layer 52 is formed. The first conductor layer (58A) includes the pads (58APD) and the metal post conductor circuit (58AP). As illustrated in FIG. 2D, the outermost first insulating layer (70A) is formed on the first surface (F) of the first resin insulating layer (50A), the first electrolytic plating film 56, and the second electrolytic plating film 80. In this case, the first electrolytic plating film 56 and the second electrolytic plating film 80 are embedded in the outermost first insulating layer (70A). The outermost first insulating layer (70A) is subjected to thinning Examples of methods for thinning the outermost first insulating layer (70A) include plasma processing and blast processing. By thinning the outermost first insulating layer (70A), a portion of the second electrolytic plating film 80 is exposed from the outermost first insulating layer (70A). The second openings (71F) exposing the pads (58APD) are formed in the outermost first insulating layer (70A). An example of a method for forming the second openings (71F) is laser processing. Or, the second openings (71F) can be formed using the method for thinning the outermost first insulating layer (70A). In this case, thinning the outermost first insulating layer (70A) and forming the second openings (71F) are simultaneously performed. The corrosion resistant layer 84 covering the protruding portions (86P) is formed. The corrosion resistant layer 84 is formed on the pads (58APD). The corrosion resistant layer 84 on the protruding portions (86P) and the corrosion resistant layer 84 on the pads (58APD) are simultaneously formed. The printed wiring board 10 illustrated in FIG. 1A is formed.

The second electrolytic plating film 80 can be polished between the formation of the second electrolytic plating film 80 and the removal of the second plating resist layer 88. Variation in height of the second electrolytic plating film 80 can be reduced. When the second electrolytic plating film 80 is formed on the first electrolytic plating film 56, unevenness can be formed on a surface of the first electrolytic plating film 56 and on a surface of the second electrolytic plating film 80. The surfaces each include a side surface and an upper surface. When the second electrolytic plating film 80 is formed on the first electrolytic plating film 56, unevenness is formed on the first electrolytic plating film 56 exposed from the second electrolytic plating film 80. After the unevenness is formed, the outermost first insulating layer (70A) is formed. For example, the seed layer 52 is removed using an etching solution. Depending on etching conditions, shapes of the metal posts 86 can be controlled. The etching conditions include a type of the etching solution, a concentration of the etching solution, a temperature of the etching solution, a method for supplying the etching solution, and the like.

Method for Manufacturing Modified Embodiment

The core substrate 30 having the third surface (F3) and the fourth surface (F4) may be formed using a known method. The core substrate 30 is formed to include: the resin substrate 20 having the third surface (F3) and the fourth surface (F4) on an opposite side with respect to the third surface (F3); the third conductor layer (34A) on the third surface (F3); the fourth conductor layer (34B) on the fourth surface (F4); and the through-hole conductors 36 that penetrate the resin substrate 20 and connect the third conductor layer (34A) and the fourth conductor layer (34B) to each other. The first resin insulating layer (50A) is formed on the third surface (F3) of the core substrate 30. The second resin insulating layer (50B) is formed on the fourth surface (F4) of the core substrate 30. Openings (51F) reaching the third conductor layer (34A) are formed in the first resin insulating layer (50A) using $CO_2$ gas laser. Openings (51S) reaching the fourth conductor layer (34B) are formed in the second resin insulating layer (50B). An electroless copper plating film 52 as the seed layer is formed on the first resin insulating layer (50A) and on the second resin insulating layer (50B). The electroless copper plating film 52 is also formed on the inner walls of the openings (51F, 51S). The same processing as in the manufacturing method of the embodiment is performed on the seed layer 52 formed on the first resin insulating layer (50A). The fifth conductor layer (58B) is formed on the seed layer 52 formed on the second resin insulating layer (50B) using a semi-additive method. The outermost second insulating layer (70B) is formed on the second resin insulating layer (50B) and the fifth conductor layer (58B). The outermost second insulating layer (70B) has the openings (71S) exposing the fifth conductor layer (58B). The fifth conductor layer (58B) exposed from the openings (71S) forms the second pads (73S). The corrosion resistant layers 84 on the protruding portions (86P), on the pads (58APD) and on the second pads (73S) are simultaneously formed. The printed wiring board 100 of the modified embodiment illustrated in FIG. 1B is formed.

Figure 3C:
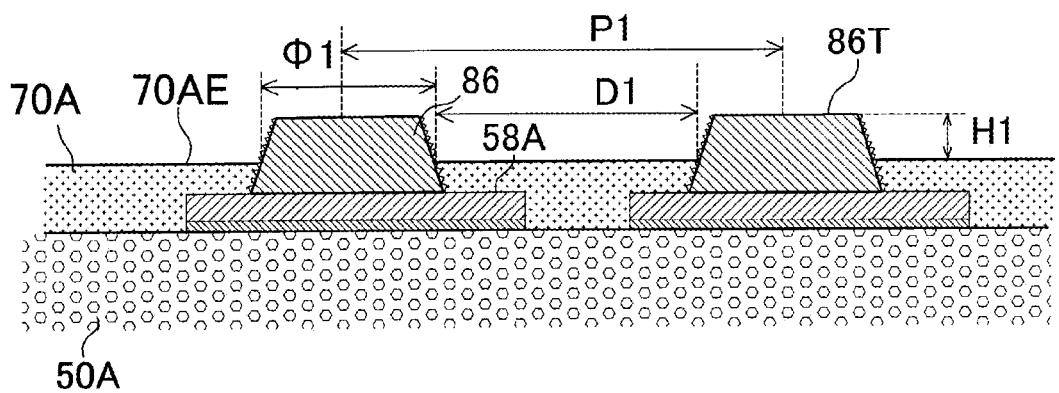
FIG. 3C illustrates dimensions of metal posts.

FIG. 3C illustrates a diameter (φ1) of each of the metal posts 86, a pitch (P1) between adjacent metal posts 86, a distance (insulation interval) (D1) between adjacent metal posts 86, and a height (H1) of each of the metal posts 86. The diameter (φ1) of each of the metal posts 86 is 25 μm or more and 50 μm or less. The pitch (P1) between adjacent metal posts 86 is 60 μm or more and 90 μm or less. The insulation interval (D1) between adjacent metal posts 86 is 25 μm or more and 45 μm or less. The height (H1) is 3 μm or more. The height (H1) is 10 μm or less. The height (H1) is preferably 7 μm or less. Reliability of insulation between the metal posts 86 and reliability of connection via the metal posts 86 can be increased. The metal posts 86 protrude from an exposed surface (70AE) of the outermost first insulating layer (70A). For example, the diameter (φ1) and the distance (D1) are measured at the position of the exposed surface (70AE). The height (H1) is a distance between the exposed surface (70AE) and the upper surface (86T).

According to FIG. 6G of Japanese Patent Application Laid-Open Publication No. 2015-195305, the conductor post 35 is formed on a mounting pattern 25 embedded in a resin insulating layer 11. The conductor post 35 of Japanese Patent Application Laid-Open Publication No. 2015-195305 is formed of a metal layer 32, a first metal film 33, and a second metal film 34. In this way, the conductor post 35 of Japanese Patent Application Laid-Open Publication No. 2015-195305 is formed of multiple members. Therefore, there is an interface in the conductor post 35 of the printed wiring board of Japanese Patent Application Laid-Open Publication No. 2015-195305. When an electronic component is mounted on the printed wiring board of Japanese Patent Application Laid-Open Publication No. 2015-195305 via the conductor post 35, since the electronic component and the printed wiring board have different thermal expansion coefficients, it is thought that the conductor post 35 is subjected to a large stress. The stress is expected to concentrate on the interface in the conductor post 35. Therefore, resistance of the conductor post 35 is expected to increase.

A printed wiring board according to an embodiment of the present invention includes: a resin insulating layer having a first surface and a second surface on an opposite side with respect to the first surface; a conductor layer formed on the first surface of the resin insulating layer; an outermost insulating layer formed on the first surface of the resin insulating layer and the conductor layer, and having a first opening reaching the conductor layer; and a metal post formed in the first opening and protruding from the outermost insulating layer.

A method for manufacturing a printed wiring board according to another embodiment of the present invention includes: preparing a resin insulating layer; preparing an outermost insulating layer; forming a seed layer on the resin insulating layer; forming a first plating resist on the seed layer; forming a first electrolytic plating film on the seed layer exposed from the first plating resist; removing the first plating resist; forming a second plating resist on the seed layer and on the first electrolytic plating film; forming a second electrolytic plating film on the first electrolytic plating film exposed from the second plating resist; removing the second plating resist; removing the seed layer exposed from the first electrolytic plating film; forming the outermost insulating layer on the seed layer, the first electrolytic plating film and the second electrolytic plating film such that the first electrolytic plating film and the second electrolytic plating film are embedded in the outermost insulating layer; and thinning the outermost insulating layer such that a portion of the second electrolytic plating film protrudes from the outermost insulating layer.

According to an embodiment of the present invention, the metal post is formed of one member. There is no interface in the metal post. Therefore, even when the metal post is subjected to a large stress, connection reliability of the metal post is unlikely to decrease. Resistance of the metal post is unlikely to change. A metal post conductor circuit and the metal post can be formed of an electrolytic plating film. In this case, reliability of connection between the metal post conductor circuit and the metal post can be increased.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer;
   a conductor layer formed on a surface of the resin insulating layer;
   an outermost insulating layer formed on the resin insulating layer such that the outermost insulating layer is covering the conductor layer and has an opening extending to the conductor layer; and
   a metal post formed in the opening of the outermost insulating layer such that the metal post is protruding from the outermost insulating layer,
   wherein the metal post is formed such that the metal post has a first opening inner-side portion formed in the opening of the outermost insulating layer and a protruding portion protruding from the outermost insulating layer, the metal post is formed such that a side surface of the first opening inner-side portion and a side surface of the protruding portion have unevenness, the unevenness formed on the side surface of the first opening inner-side portion is first unevenness, and the unevenness formed on the side surface of the protruding portion is second unevenness such that a size of the first unevenness is larger than a size of the second unevenness.

2. The printed wiring board according to claim 1, wherein the conductor layer and the metal post are not integrally formed.

3. The printed wiring board according to claim 2, wherein the metal post is formed such that the conductor layer and the metal post have an interface between the conductor layer and the metal post.

4. The printed wiring board according to claim 2, wherein the conductor layer includes a seed layer formed on the surface of the resin insulating layer and a first electrolytic plating film formed on the seed layer, and the metal post includes a second electrolytic plating film such that the second electrolytic plating film is formed directly on the first electrolytic plating film of the conductor layer.

5. The printed wiring board according to claim 4, wherein the second electrolytic plating film and the first electrolytic plating film are formed by using the seed layer.

6. The printed wiring board according to claim 4, wherein the metal post is formed such that the protruding portion has a corrosion resistant layer formed thereon.

7. The printed wiring board according to claim 2, wherein the metal post has a lower surface facing the conductor layer and an upper surface on an opposite side with respect to the lower surface and formed such that the metal post has a thickness that becomes thicker from the upper surface toward the lower surface.

8. The printed wiring board according to claim 1, wherein the conductor layer includes a first electrolytic plating film, the metal post includes a second electrolytic plating film such that the second electrolytic plating film of the metal post is directly connected to the first electrolytic plating film in the conductor layer.

9. The printed wiring board according to claim 1, wherein the metal post has a lower surface facing the conductor layer and an upper surface on an opposite side with respect to the lower surface and formed such that the metal post has a thickness that becomes thicker from the upper surface toward the lower surface.

10. The printed wiring board according to claim 1, wherein the metal post is formed such that the protruding portion has a corrosion resistant layer formed thereon.

11. The printed wiring board according to claim 10, wherein the conductor layer includes a pad and a metal post conductor circuit such that the metal post is formed on the metal post conductor circuit of the conductor layer, and the outermost insulating layer has a second opening exposing the pad such that the corrosion resistant layer is formed on the pad exposed by the second opening.

12. The printed wiring board according to claim 1, further comprising:
    a via conductor penetrating through the resin insulating layer,
    wherein the conductor layer includes a metal post conductor circuit extending from the via conductor and integrally formed with the via conductor such that the metal post is formed on the metal post conductor circuit of the conductor layer and that the via conductor becomes thicker toward the metal post conductor circuit.

13. The printed wiring board according to claim 1, wherein the metal post comprises an electrolytic plating film formed on the conductor layer.

14. The printed wiring board according to claim 1, wherein the metal post comprises an electrolytic plating film formed directly on a surface of the conductor layer.

15. The printed wiring board according to claim 1, wherein the conductor layer includes a first electrolytic plating film, and the metal post includes a second electrolytic plating film such that the second electrolytic plating film is formed directly on the first electrolytic plating film of the conductor layer.

16. The printed wiring board according to claim 1, wherein the size of the second unevenness is formed small such that migration from the side surface of the protruding portion of the metal post is suppressed when a solder bump is formed on the side surface of the protruding portion of the metal post.

17. The printed wiring board according to claim 1, wherein the metal post is formed such that the metal post has an upper surface in the protruding portion of the metal post, that the upper surface of the metal post has third unevenness and that the size of the first unevenness is larger than a size of the third unevenness.

18. The printed wiring board according to claim 1, wherein the metal post is formed such that the metal post has a middle portion connecting the first opening inner-side portion and the protruding portion such that the middle portion is protruding from the outermost insulating layer.

19. A method for manufacturing a printed wiring board, comprising:
    forming a seed layer on a resin insulating layer;
    forming an electrolytic plating film on the seed layer;
    forming a metal post comprising electrolytic plating on the electrolytic plating film;
    removing the seed layer exposed from the electrolytic plating film;
    forming an outermost insulating layer on the seed layer, the electrolytic plating film and the metal post such that the electrolytic plating film and the metal post are embedded in the outermost insulating layer; and
    thinning the outermost insulating layer such that a portion of the metal post comprising the electrolytic plating protrudes from the outermost insulating layer,
    wherein the thinning of the outermost insulating layer includes forming an embedded portion of the metal post embedded in the outermost insulating layer and a protruding portion of the metal post protruding from the outermost insulating layer such that unevenness of a side surface of the embedded portion is larger than unevenness of a side surface of the protruding portion.

20. The method for manufacturing a printed wiring board according to claim 19, wherein the forming of the electrolytic plating film includes forming a first plating resist on the seed layer, forming the electrolytic plating film on the seed layer exposed from the first plating resist, and removing the first plating resist, and the forming of the metal post includes forming a second plating resist on the seed layer and on the electrolytic plating film, forming the metal post on the electrolytic plating film exposed from the second plating resist, and removing the second plating resist.

* * * * *